(12) United States Patent
Kim et al.

(10) Patent No.: US 8,884,698 B2
(45) Date of Patent: Nov. 11, 2014

(54) TRANSFORMER AND CMOS POWER AMPLIFIER INCLUDING THE SAME

(75) Inventors: Youn Suk Kim, Daejeon-si (KR); Ki Joong Kim, Gyeonggi-do (KR); Jun Goo Won, Gyeonggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 12 days.

(21) Appl. No.: 13/480,394

(22) Filed: May 24, 2012

(65) Prior Publication Data

US 2012/0319779 A1    Dec. 20, 2012

(30) Foreign Application Priority Data

Jun. 17, 2011    (KR) .................. 10-2011-0059156

(51) Int. Cl.
   *H03F 1/00*    (2006.01)
(52) U.S. Cl.
   USPC .......................................... 330/165; 330/276
(58) Field of Classification Search
   USPC ......... 330/154, 157, 165, 171, 188, 190, 195, 330/197, 276; 336/200
   See application file for complete search history.

(56) References Cited

U.S. PATENT DOCUMENTS

| | | | | |
|---|---|---|---|---|
| 6,794,977 | B2* | 9/2004 | Christensen | 336/200 |
| 7,164,339 | B2* | 1/2007 | Huang | 336/200 |
| 7,525,407 | B2* | 4/2009 | Lee et al. | 336/200 |
| 7,656,264 | B2* | 2/2010 | Hsu et al. | 336/223 |
| 7,808,356 | B2* | 10/2010 | Papananos | 336/200 |
| 8,044,759 | B2* | 10/2011 | Yang et al. | 336/200 |

FOREIGN PATENT DOCUMENTS

| | | |
|---|---|---|
| KR | 10-2005-0045751 A | 5/2005 |
| KR | 10-2009-0076840 A | 7/2009 |
| KR | 10-2009-0118605 A | 11/2009 |

* cited by examiner

*Primary Examiner* — Khanh V Nguyen
(74) *Attorney, Agent, or Firm* — Bracewell & Giuliani LLP; Brad Y. Chin

(57) ABSTRACT

Disclosed herein is a transformer including: a primary coil formed of a first conductor having a predetermined length and including a first end and second end for receiving a signal, wherein the first conductor is formed as a first loop; and a secondary coil that is coupled to the primary coil in an electromagnetic coupling, and is formed of a second conductor having a predetermined length and including a first end and a second end for outputting a signal, wherein the second conductor is formed as a second loop, wherein the primary coil and the secondary coil are stacked while crossing each other. Accordingly, power transformer efficiency may be increased.

10 Claims, 3 Drawing Sheets

TRANSFORMER AND CMOS POWER AMPLIFIER INCLUDING THE SAME

CROSS REFERENCE(S) TO RELATED APPLICATIONS

This application claims the benefit under 35 U.S.C. Section 119 of Korean Patent Application Serial No. 10-2011-0059156, entitled "Transformer and CMOS Power Amplifier Including the Same" filed on Jun. 17, 2011, which is hereby incorporated by reference in its entirety into this application.

BACKGROUND OF THE INVENTION

1. Technical Field

The present invention relates to a transformer and a complementary metal-oxide-semiconductor (CMOS) power amplifier including the same, and more particularly, to a transformer in which structures of primary and secondary coils may be improved to improve power transmission efficiency, and a CMOS power amplifier including the same.

2. Description of the Related Art

In general, in a wireless communication system such as a mobile communication terminal, a power amplifier is used to transmit and receive signals in a wireless manner.

The power amplifier refers to a device that efficiently amplifies minute signals to larger signals with small distortion and supplies the amplified signals to a load via an antenna. The power amplifier is classified, according to frequencies, as a low-frequency power amplifier and a high-frequency power amplifier.

In addition, the power amplifier also includes a complementary metal-oxide-semiconductor (CMOS) power amplifier which is designed using a general-purpose CMOS process with a process of GaAs, which is a special semiconductor Since the CMOS power amplifier may be mass-produced, the costs therefor may be reduced, and various functions may be included in the CMOS power amplifier.

The CMOS power amplifier includes a driver amplifying unit and a power amplifying unit, and the driver amplifying unit and the power amplifying unit are provided in a differential structure in which they amplify signals of different phases. In addition, a transformer is included between the driver amplifying unit and the power amplifying unit for matching.

However, according to the conventional art, when forming the transformer, a primary coil and a secondary coil are implemented on the same plane, and when the primary coil and the secondary coil are implemented on the same plane, a coupling efficiency decreases, as the coupling efficiency is decreased, the power transmission efficiency also decreases.

In addition, when the primary coil and the secondary coil are disposed too close to each other on the same plane, problems such as a short circuit may be generated.

Thus, a method of increasing the power transmission efficiency by improving the structures of the primary and secondary coils of the transformer to dispose the primary and secondary coils close to each other while preventing a short circuit is suggested.

SUMMARY OF THE INVENTION

An object of the present invention is to provide a transformer in which structures of a primary coil and a secondary coil of the transformer are improved so as to dispose the primary coil and the secondary coil close to each other and to thereby increase power transmission efficiency, and a CMOS power amplifier including the same.

According to an exemplary embodiment of the present invention, there is provided a transformer, including: a primary coil formed of a first conductor having a predetermined length and including a first end and second end for receiving a signal, wherein the first conductor is formed as a first loop; and a secondary coil that is coupled to the primary coil in an electromagnetic coupling, and is formed of a second conductor having a predetermined length and including a first end and a second end for outputting a signal, wherein the second conductor is formed as a second loop, wherein the primary coil and the secondary coil are stacked while crossing each other.

The primary and secondary coils may be concentric, and be linearly symmetrical with respect to a diameter line that passes a concentric center of the primary and secondary coils.

A first side of the primary coil may be disposed above the secondary coil and a second side of the primary coil may be disposed below the secondary coil, based on the diameter line.

The primary coil may receive differential signals having different phases via the first end and the second end thereof.

The primary coil may have the first end to which a signal (Pin+) having a positive (+) level of the differential signals is input and the second end to which a signal (Pin−) having a negative (−) level thereof is input.

According to another exemplary embodiment of the present invention, there is provided a transformer including: at least one primary coil formed of a first conductor having a predetermined length and including a first end and a second end for receiving a signal, wherein the first conductor is formed as a first loop; and at least one secondary coil that is coupled to the at least one primary coil in an electromagnetic coupling, and is formed of a second conductor having a predetermined length and including a first end and a second end for outputting a signal, wherein the second conductor is formed as a second loop, wherein the primary and secondary coils are stacked while having gaps therebetween, and the secondary coils are alternately inserted between the at least one primary coil.

The at least one primary coil may receive differential signals having different phases via the first end and the second end thereof.

The at least one primary coil may have the first end to which a signal (Pin+) having a positive (+) level of the differential signals is input and the second end to which a signal (Pin−) having a negative (−) level thereof is input.

According to another exemplary embodiment of the present invention, there is provided a complementary metal-oxide-semiconductor (CMOS) power amplifier including: a first amplifying unit amplifying an input signal; a transformer including a primary coil formed of a first conductor having a predetermined length and including a first end and a second end for receiving a signal, wherein the first conductor is formed as a first loop, and a secondary coil that is coupled to the primary coil by electromagnetic coupling, and is formed of a second conductor having a predetermined length and including a first end and a second end for outputting a signal, wherein the second conductor is formed as a second loop, wherein the primary coil and the secondary coil are stacked while crossing each other; and a second amplifying unit amplifying a signal output from the transformer.

The primary and secondary coils may be concentric, and be linearly symmetrical with respect to a diameter line that passes a concentric center of the primary and secondary coils.

A first side of the primary coil may be disposed above the secondary coil and a second side of the primary coil may be disposed below the secondary coil, based on the diameter line.

According to another exemplary embodiment of the present invention, there is provided a complementary metal-oxide-semiconductor (CMOS) power amplifier comprising: a first amplifying unit amplifying an input signal; a transformer including at least one primary coil formed of a first conductor having a predetermined length and including a first end and a second end for receiving a signal, wherein the first conductor is formed as a first loop, and at least one secondary coil that is coupled to the at least one primary coil in an electromagnetic coupling, and is formed of a second conductor having a predetermined length and including a first end and a second end for outputting a signal, wherein the second conductor is formed as a second loop, wherein the primary and secondary coils are stacked while having gaps therebetween, and the secondary coils are alternately inserted between the at least one primary coil; and a second amplifying unit amplifying a signal output from the transformer.

The at least one primary coil may receive differential signals having different phases via the first end and the second end thereof.

The at least one primary coil may have the first end to which a signal (Pin+) having a positive (+) level of the differential signals is input and the second end to which a signal (Pin−) having a negative (−) level thereof is input.

DESCRIPTION OF THE PREFERRED EMBODIMENTS

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

Therefore, the configurations described in the embodiments and drawings of the present invention are merely most preferable embodiments but do not represent all of the technical spirit of the present invention. Thus, the present invention should be construed as including all the changes, equivalents, and substitutions included in the spirit and scope of the present invention at the time of filing this application.

Hereinafter, exemplary embodiments of the present invention will be described with reference to the accompanying drawings.

Figure 1:
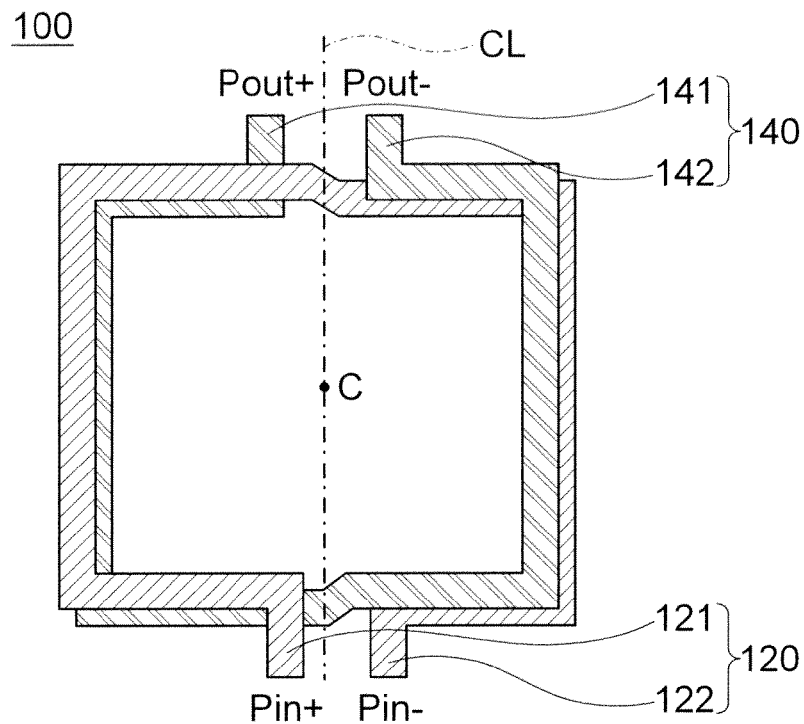
FIG. 1 is a configuration diagram of a transformer according to an embodiment of the present invention.

FIG. 1 is a configuration diagram of a transformer according to an embodiment of the present invention.

As illustrated in FIG. 1, the transformer 100 includes a primary coil 120 and a secondary coil 140.

Here, the transformer 100 refers to a device that performs, when connecting two circuits, impedance matching for equalizing impedance of the two circuits so as to prevent reflection loss.

The primary coil 120 is a unit for receiving a signal, and is formed of a first conductor that has a predetermined length and includes a first end 121 and a second end 122 for receiving signals, wherein the first conductor is formed as a first loop.

A complementary metal-oxide-semiconductor (CMOS) power amplifier in which the transformer 100 installed is formed to have a differential structure that amplifies a signal to generate a signal having different phases, and thus, the primary coil 120 has the first end 121 to which a signal Pin+ having a positive (+) level of the differential signals is input and the second end 122 to which a signal Pin− having a negative (−) level thereof is input.

The secondary coil 140 is coupled to the primary coil 120 in an electromagnetic coupling; the secondary coil 140 is formed of a second conductor that has a predetermined length and includes a first end 141 and a second end 142 for outputting signals, wherein the second conductor forms a second loop. The secondary coil 140 is wound with the primary coil 120 at a previously set winding ratio so that power conversion may be conducted first from the primary coil 120 at the winding ratio.

In addition, the secondary coil 140 has the first end 141 from a signal Pout+ having a positive (+) level of the differential signals is output and the second end 142 from a signal Pout− having a negative (−) level thereof is output.

Meanwhile, the primary and secondary coils 120 and 140 may be formed to be stacked while crossing each other, and are concentric with respect to the same center C, and are formed to be linearly symmetrical with respect to a diameter line CL that passes the same center C.

In detail, a first side of the primary coil 120 is disposed above the secondary coil 140 and a second side thereof is disposed below the secondary coil 140, based on the diameter line CL. That is, one side of the primary coil 120 with the first end 121 is disposed above the secondary coil 140 and the other side of the primary coil 120 with the second end 122 is disposed below the secondary coil 140, based on the diameter line CL.

As described above, in the transformer according to the current embodiment of the present invention, as the primary and secondary coils 120 and 140 are stacked while crossing each other, the primary and secondary coils 120 and 140 are disposed close to each other compared to the conventional art, thereby increasing coupling efficiency. Accordingly, power transmission efficiency may be increased.

Figure 2:
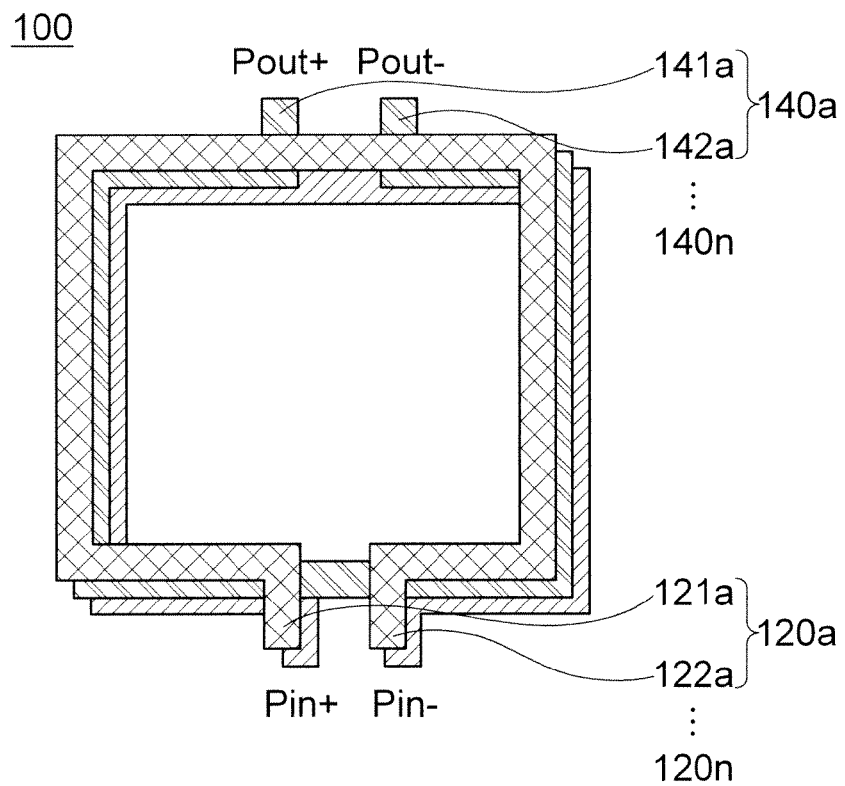
FIG. 2 is a configuration diagram of a transformer according to another embodiment of the present invention.

FIG. 2 is a configuration diagram of a transformer according to another embodiment of the present invention.

As illustrated in FIG. 2, the transformer 100 includes at least one primary coil 120, that is, a plurality of primary coils 120a through 120n and at least one secondary coil 140, that is, a plurality of secondary coils 140a through 140n.

At least one primary coil 120 (120a through 120n) is a unit for receiving a signal, and is formed of a first conductor that has a predetermined length and includes a first end 121 (121a through 121n) and a second end 122 (122a through for receiving signals, wherein the first conductor is formed as a first loop.

In addition, a plurality of primary coils 120 (120a through 120n) are stacked while having gaps therebetween.

A CMOS power amplifier in which the transformer 100 is installed is formed to have a differential structure that amplifies signals to generate signals having different phases, and thus, the primary coil 120 (120a through 120n) has the first end 121 (121*a* through 121*n*) to which a signal Pin+ having a positive (+) level of the differential signals is input and the second end 122 (122*a* through 122*n*) to which a signal Pin– having a negative (–) level thereof is input.

At least one secondary coil 140 (140*a* through 140*n*) is coupled to at least one primary coil 120 (120*a* through 120*n*) by electromagnetic coupling; at least one secondary coil 140 is formed of a second conductor that has a predetermined length and includes a first end 141 (141*a* through 141*n*) and a second end 142 (142*a* through 142*n*) for outputting signals, wherein the second conductor is formed as a second loop. The secondary coil 140 (140*a* through 140*n*) is wound with the primary coil 120 (120*a* through 120*n*) at a previously set winding ratio so that power conversion may be conducted from the primary coil 120 (120*a* through 120*n*) at the winding ratio.

In addition, the secondary coil 140 (140*a* through 140*n*) has the first end 141 (141*a* through 141*n*) from which a signal Pout+ having a positive (+) level of the differential signals is output and the second end 142 (142*a* through 142*n*) from which a signal Pout– having a negative (–) level thereof is output.

Also, a plurality of secondary coils 140 (140*a* through 140*n*) is stacked while having gaps therebetween.

In detail, the primary and secondary coils 120 and 140 are stacked such that gaps are included between the first and second conductors, wherein the second conductor is alternately inserted between at least one first conductor.

As described above, according to the transformer 100 of the current embodiment of the present invention, the primary coils 120 (120*a* through 120*n*) and the secondary coils 140 (140*a* through 140*n*) are disposed closer to each other, as compared to the conventional art, in a structure in which the second coils 140 (140*a* through 140*n*) are alternately inserted between the plurality of primary coils 120 (120*a* through 120*n*), and thus a coupling efficiency may be further increased, and accordingly, power transmission efficiency may be further increased.

Figure 3:
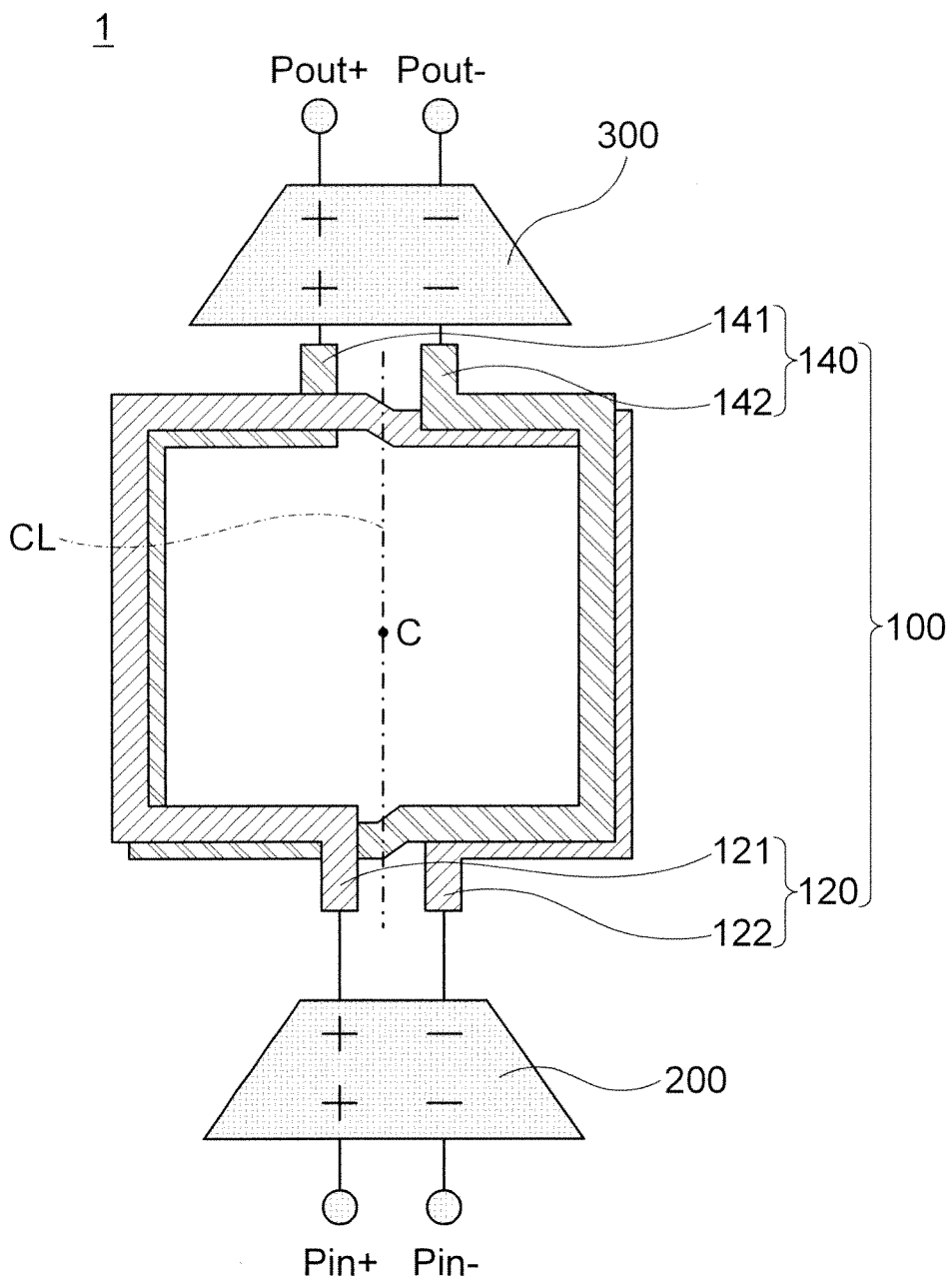
FIG. 3 is a configuration diagram of a complementary metal-oxide-semiconductor (CMOS) power amplifier according to an embodiment of the present invention.

FIG. 3 is a configuration diagram of a CMOS power amplifier 1 according to an embodiment of the present invention.

As illustrated in FIG. 3, the CMOS power amplifier 1 includes a transformer 100, a first amplifying unit 200, and a second amplifying unit 300.

The transformer 100 includes a primary coil 120 (120*a* through 120*n*) and a secondary coil 140.

The primary coil 120 is a unit for receiving a signal, and is formed of a first conductor that has a predetermined length and includes a first end 121 and a second end 122 for receiving signals, wherein the first conductor is formed as a first loop.

A CMOS power amplifier in which the transformer 100 is installed is formed to have a differential structure that amplifies signals to generate signals having different phases, and thus, the primary coil 121 has the first end 121 to which a signal Pin+ having a positive (+) level of the differential signals is input and the second end 122 to which a signal Pin– having a negative (–) level thereof is input.

The secondary coil 140 is coupled to the primary coil 120 by electromagnetic coupling; the secondary coil 140 is formed of a second conductor that has a predetermined length and includes a first end 141 and a second end 142 for outputting signals, wherein the second conductor forms a second loop. The secondary coil 140 is wound with the primary coil 120 at a previously set winding ratio so that power conversion may be conducted first from the primary coil 120 at the winding ratio.

In addition, the secondary coil 140 has the first end 141 from which a signal Pout+ having a positive (+) level of the differential signals is output and the second end 142 from which a signal Pout– having a negative (–) level thereof is output.

Meanwhile, the primary and secondary coils 120 and 140 may be formed to be stacked while crossing each other, and are concentric with respect to the same center C, and are formed to be linearly symmetrical with respect to a diameter line CL that passes the same center C.

In detail, a first side of the primary coil 120 is disposed above the secondary coil 140 and a second side thereof is disposed below the secondary coil 140, based on the diameter line CL. That is, one side of the primary coil 120 with the first end 121 is disposed above the secondary coil 140 and the other side of the primary coil 120 with the second end 122 is disposed below the secondary coil 140, based on the diameter line CL.

The transformer 100 is described above with reference to FIG. 1, and thus a detailed description thereof will be omitted.

The first amplifying unit 200 is formed of an input amplifying unit and may be electrically connected to the primary coil 120, and may amplify input signals Pin+ and Pin– with a previously set gain and transmit the same to the primary coil 120. Then, the primary coil 120 receives the amplified signals from the first amplifying unit 200, and the secondary coil 140 matches impedance of the signals which are transmitted after being coupled in an electromagnetic coupling.

Here, the input signals Pin+ and Pin– may be formed of differential signals having a phase difference of 180 degrees.

In addition, the first amplifying unit 200 may preferably be formed of a driver amplifier.

The second amplifying unit 300 may be formed of an output amplifying unit and may respectively amplify the signals that are impedance-matched by the primary and secondary coils 120 and 140 with a previously set gain and output the amplified signals.

In addition, the second amplifying unit 300 may be formed of a power amplifier that amplifies power of differential signals via the first end 141 and the second end 142 of the secondary coil 140 of the transformer 100 and outputs the differential signals via the first and second output ends out+ and out–.

Figure 4:
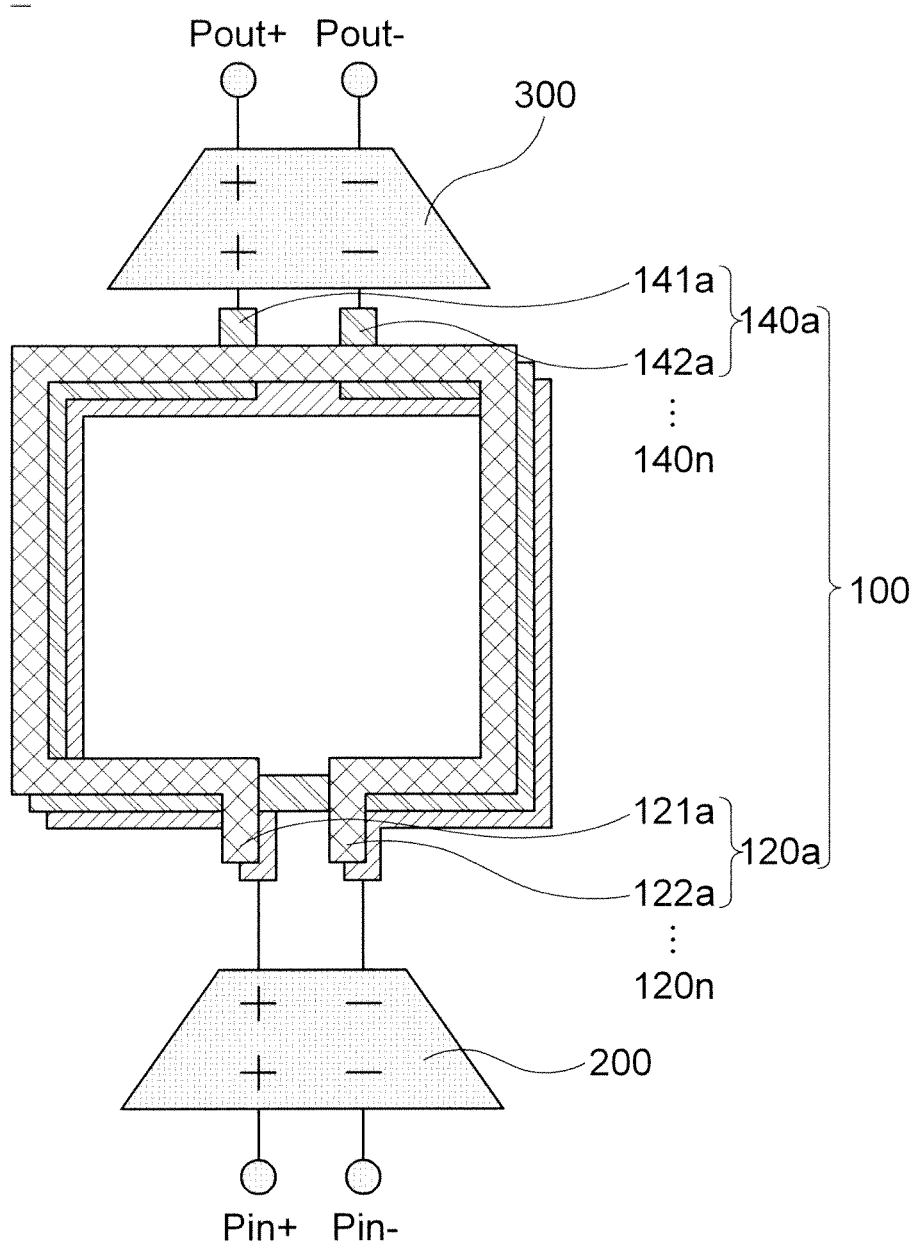
FIG. 4 is a configuration diagram of a CMOS power amplifier according to another embodiment of the present invention.

FIG. 4 is a configuration diagram of a CMOS power amplifier according to another embodiment of the present invention.

As illustrated in FIG. 4, the CMOS power amplifier 1 includes a transformer 100, a first amplifying unit 200, and a second amplifying unit 300.

The transformer 100 includes a primary coil 120 and a secondary coil 140.

At least one primary coil 120 (120*a* through 120*n*) is a unit for receiving a signal, and each of a plurality of primary coils 120 (120*a* through 120*n*) is formed of a first conductor that has a predetermined length and includes a first end 121 (121*a* through 121*n*) and a second end 122 (122*a* through 122*n*) for receiving signals, wherein the first conductor is formed as a first loop.

In addition, a plurality of primary coils 120 (120*a* through 120*n*) is stacked while including gaps therebetween.

A CMOS power amplifier in which the transformer 100 is installed is formed to have a differential structure that amplifies signals to generate signals having different phases, and thus, the primary coil 120 (120*a* through 120*n*) has the primary coil 120 (120*a* through 120*n*) to which a signal Pin+ having a positive (+) level of the differential signals is input and the second end 122 (122*a* through 122*n*) to which a signal Pin– having a negative (–) level thereof is input.

At least one secondary coil 140 (140a through 140n) is coupled to at least one primary coil 120 (120a through 120n) by electromagnetic coupling; at least one secondary coil 140 is formed of a second conductor that has a predetermined length and includes a first end 141 (141a through 141n) and a second end 142 (142a through 142n) for outputting signals, wherein the second conductor forms a second loop. The secondary coil 140 (140a through 140n) is wound with the primary coil 120 (120a through 120n) at a previously set winding ratio so that power conversion may be conducted from the primary coil 120 (120a through 120n) at the winding ratio.

In addition, the secondary coil 140 has the first end 141 (141a through 141n) from which a signal Pout+ having a positive (+) level of the differential signals is output and the second end 142 (142a through 142n) from which a signal Pout− having a negative (−) level thereof is output.

Also, a plurality of secondary coils 140 (140a through 140n) are stacked while including gaps therebetween.

In detail, the primary and secondary coils 120 and 140 are stacked such that the first and second conductors are stacked while having gaps therebetween, wherein the second conductors are alternately inserted between the plurality of first conductors.

The transformer 100 is described above with reference to FIG. 2, and thus detailed description thereof will be omitted.

The first amplifying unit 200 is formed of an input amplifying unit and may be electrically connected to the primary coil 120, and may amplify input signals Pin+ and Pin− with a previously set gain and transmit the same to the primary coil 120. Then, the primary coil 120 receives the amplified signal from the first amplifying unit 200, and the secondary coil 140 matches impedance of the signal which is transmitted after being coupled by electromagnetic coupling.

Here, the input signals Pin+ and Pin− may be formed of differential signals having a phase difference of 180 degrees.

In addition, the first amplifying unit 200 may preferably be formed of a driver amplifier.

The second amplifying unit 300 may be formed of an output amplifying unit and may respectively amplify the signals that are impedance-matched by the primary and secondary coils 120 and 140 with a previously set gain and output the amplified signals.

In addition, the second amplifying unit 300 may be formed of a power amplifier that amplifies power of differential signals via the first end 141 and the second end 142 of the secondary coil 140 of the transformer 100 and outputs the differential signals via the first and second output ends out+ and out−.

According to the transformer and the CMOS power amplifier including the same of the embodiments of the present invention as described above, the primary and secondary coils of the transformer are formed to be stacked while crossing each other so as to be disposed close to each other, thereby increasing coupling efficiency. Accordingly, power transmission efficiency may be increased In addition, by forming a plurality of primary and secondary coils in a stacked structure, and alternately inserting the primary coils between the secondary coils, coupling efficiency may be further increased, and thus power transmission efficiency may also be further increased.

Although the present invention has been shown and described with the exemplary embodiment as described above, the present invention is not limited to the exemplary embodiment as described above, but may be variously changed and modified by those skilled in the art to which the present invention pertains without departing from the scope of the present invention.

What is claimed is:

1. A transformer comprising:
    a primary coil formed of a first conductor having a predetermined length and including a first end and second end for receiving a signal, wherein the first conductor is formed as a first loop; and
    a secondary coil that is coupled to the primary coil by electromagnetic coupling, and is formed of a second conductor having a predetermined length and including a first end and a second end for outputting a signal, wherein the second conductor is formed as a second loop,
    wherein the primary and secondary coils are concentric, and are linearly symmetrical with respect to a diameter line that passes a concentric center of the primary and secondary coils, and a first side of the primary coil is disposed above the secondary coil and a second side of the primary coil is disposed below the secondary coil, based on the diameter line.

2. The transformer according to claim 1, wherein the primary coil receives differential signals having different phases via the first end and the second end thereof.

3. The transformer according to claim 2, wherein the primary coil has the first end to which a signal (Pin−) having a positive (+) level of the differential signals is input and the second end to which a signal (Pin−) having a negative (+) level thereof is input.

4. A transformer comprising:
    at least one primary coil formed of a first conductor having a predetermined length and including a first end and a second end for receiving a signal, wherein the first conductor is formed as a first loop; and
    at least one secondary coil that is coupled to the at least one primary coil by electromagnetic coupling, and is formed of a second conductor having a predetermined length and including a first end and a second end for Outputting a signal, wherein the second conductor is formed as a second loop,
    wherein the primary and secondary coils are stacked while having gaps therebetween, and each of the secondary coils is alternately placed following a corresponding one of each of the primary coils.

5. The transformer according to claim 4, wherein the at least one primary coil receives differential signals having different phases via the first end and the second end thereof.

6. The transformer according to claim 5, wherein the at least one primary coil has the first end to which a signal (Pin+) having a positive (±) level of the differential signals is input and the second end to which a signal (Pin−) having a negative (+) level thereof is input.

7. A complementary metal-oxide-semiconductor (CMOS) power amplifier comprising:
    a first amplifying unit amplifying an input signal;
    a transformer including a primary coil formed of a first conductor having a predetermined length and including a first end and a second end for receiving a signal, wherein the first conductor is formed as a first loop, and a secondary coil that is coupled to the primary coil by electromagnetic coupling, and is formed of a second conductor having a predetermined length and including a first end and a second end for outputting a signal, wherein the second conductor is formed as a second loop, wherein the primary and secondary coils are concentric, and are linearly symmetrical with respect to a diameter line that passes a concentric center of the primary and secondary coils, and a first side of the primary coil is disposed above the secondary coil and a second side of the primary coil is disposed below the secondary coil, based on the diameter line; and a second amplifying unit amplifying a signal output from the transformer.

8. A complementary metal-oxide-semiconductor (CMOS) power amplifier comprising:

a first amplifying unit amplifying an input signal;

a transformer including at least one primary coil formed of a first conductor having a predetermined length and including a first end and a second end for receiving a signal, wherein the first conductor is formed as a first loop, and at least one secondary coil that is coupled to the at least one primary coil in an electromagnetic coupling, and is formed of a second conductor having a predetermined length and including a first end and a second end for outputting a signal, wherein the second conductor is formed as a second loop, wherein the primary and secondary coils are stacked while having gaps therebetween, and each of the secondary coils is alternately placed following a corresponding one of each of the primary coils; and a second amplifying unit amplifying a signal output from the transformer.

9. The CMOS power amplifier according to claim 8, wherein the at least one primary coil receives differential signals having different phases via the first end and the second end thereof.

10. The CMOS power amplifier according to claim 9, wherein the at least one primary coil has the first end to which a signal (Pin+) having a positive (+) level of the differential signals is input and the second end to which a signal (Pin−) having a negative (−) level thereof is input.

\* \* \* \* \*